United States Patent
Weldon et al.

(10) Patent No.: US 6,956,922 B2
(45) Date of Patent: Oct. 18, 2005

(54) GENERATING NON-INTEGER CLOCK DIVISION

(75) Inventors: Paul J. Weldon, Copenhagen (DK); Henning Lysdal, Roskilde (DK)

(73) Assignee: Intel Corporation, Santa Clara, CA (US)

(*) Notice: Subject to any disclaimer, the term of this patent is extended or adjusted under 35 U.S.C. 154(b) by 712 days.

(21) Appl. No.: 09/968,407

(22) Filed: Sep. 28, 2001

(65) Prior Publication Data

US 2003/0063699 A1 Apr. 3, 2003

(51) Int. Cl.[7] ................................................. H03D 3/24
(52) U.S. Cl. ..................................... 375/373; 327/115
(58) Field of Search ............................. 375/373, 354, 375/376, 286, 293, 294, 211, 214–5, 371; 327/100, 105–7, 113–117, 121, 122; 377/47, 27, 52, 133, 44, 48

(56) References Cited

U.S. PATENT DOCUMENTS

| | | | | |
|---|---|---|---|---|
| 5,389,826 A | * | 2/1995 | Sonobe ......................... 307/125 |
| 6,041,093 A | * | 3/2000 | Cho .............................. 377/47 |
| 6,061,418 A | * | 5/2000 | Hassoun ....................... 377/47 |
| 6,121,801 A | * | 9/2000 | Lee .............................. 327/115 |
| 6,356,123 B1 | * | 3/2002 | Lee et al. .................... 327/115 |
| 6,489,817 B1 | * | 12/2002 | Wong et al. ................. 327/115 |

\* cited by examiner

Primary Examiner—Tesfaldet Bocure
Assistant Examiner—Krista Flanagan
(74) Attorney, Agent, or Firm—Blakely, Sokoloff, Taylor and Zafman

(57) ABSTRACT

A clock divider and method is disclosed for generating an output clock signal having a frequency that is a fractional or integral multiple of a reference clock signal frequency. In one embodiment, the clock divider divides a clock signal by a first divisor in a first period and by a second divisor in a second period, where the second period following the first period. The clock divider circuit is triggered by a first edge of the clock signal and generates a first signal. A synchronizing circuit is coupled to the clock divider to generate a second signal from the first signal, the second signal being synchronized by a second edge of the clock signal, where the second edge is in a direction opposite to the first edge. A selector is coupled to the synchronizing circuit and the clock divider to generate an output signal by selecting the first signal and the second signal alternately between the first period and the second period.

30 Claims, 3 Drawing Sheets

GENERATING NON-INTEGER CLOCK DIVISION

FIELD

Embodiments of the invention relate in general to digital circuits, and more in particular to clock division.

BACKGROUND DESCRIPTION

Clock signals are generally required to provide frequency and timing references for controlling internal processes. Recently, clock multiplier circuits have been added on chips to generate an internal clock signal from a reference clock signal. The reference clock signal is typically an external clock signal generated by a crystal oscillator or other external clock source. It may be necessary to generate an internal clock signal having the same frequency or having a frequency that is a fraction or a multiple of the reference clock signal frequency.

When the reference clock signal frequency is an integral multiple (N) of the required internal signal frequency, the internal signal may be generated using a divide-by-N counter that is clocked by the reference signal. When the required signal frequency is an integral multiple of the reference signal frequency, the internal signal may be generated using a phase-locked loop. However, in many applications, the reference signal frequency is a fractional multiple (non-integer) of the required internal signal frequency, where the fractional multiple is either less than or greater than one.

For example, in the field of communications, the required internal signal frequency is often a fractional multiple of the reference clock signal frequency. Generating the desired internal clock signal frequency in such applications while meeting the system requirements has been difficult, costly and/or requires complex hardware.

BRIEF DESCRIPTION OF THE DRAWINGS

The invention will be described in detail with reference to the following drawings in which like reference numerals refer to like elements wherein.

DESCRIPTION

In the following description, for purposes of explanation, numerous details are set forth in order to provide a thorough understanding of the present invention. However, it will be apparent to one skilled in the art that these specific details are not required in order to practice the invention. In other instances, well-known electrical structures and circuits are shown in block diagram form in order not to obscure the invention.

It is noted that one embodiment of the invention may be described as a process which is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Generally, one embodiment of the invention provides a clock divider and method for generating an internal clock signal frequency that is some non-integral as well as integral multiple of the reference clock signal frequency. In one embodiment, the clock divider produces /16, /16.5,/32 and /33 output clocks from a reference clock. Accordingly, the invention can generate a (x66) clock multiplier which may, for example, be required in the 10 Gigabit Ethernet technology.

Figure 1:
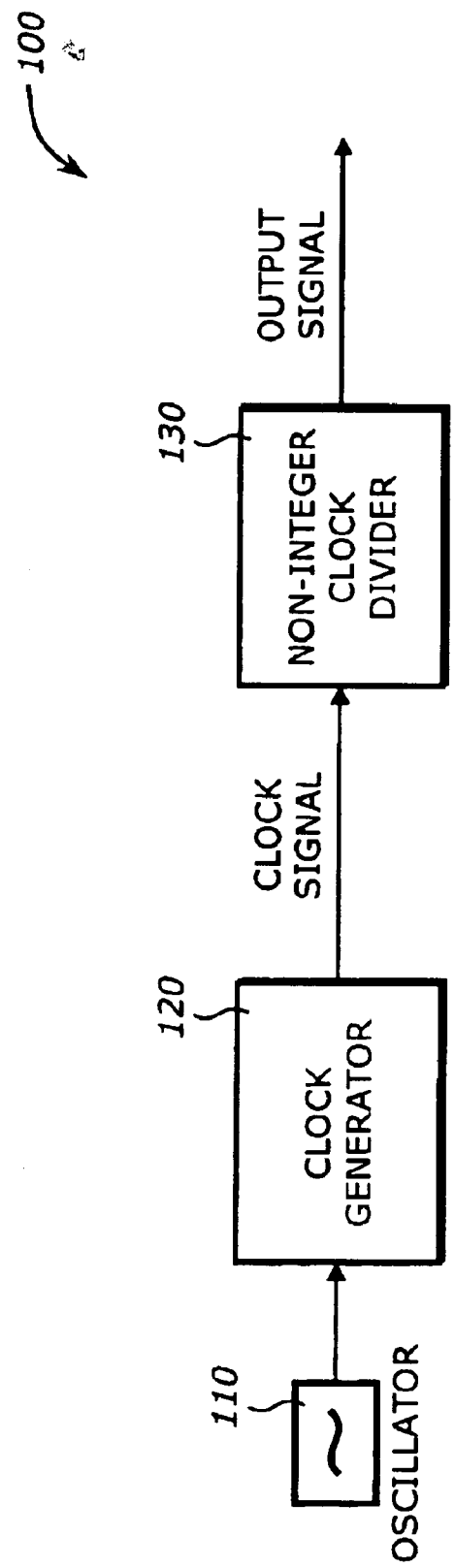
FIG. 1 is a diagram illustrating a circuit in accordance with one embodiment of the invention.

FIG. 1 is a diagram illustrating a circuit 100 in which one embodiment of the invention can be practiced. The circuit 100 includes an oscillator 110, a clock generator 120, and a non-integer clock divider 130.

The oscillator 110 provides an oscillating signal at a fixed frequency. The oscillator 110 may be a crystal oscillator or any other devices that can be used as a reference clock. In one embodiment, the frequency of the reference clock is between 1 GHz to 10 GHz. However, the frequency of the reference clock may be any other value depending on the requirements of a system.

The clock generator 120 is a circuit to generate a reference clock signal. The clock generator 120 may be a phase-locked loop circuit that synthesizes a clock signal from the reference clock. The clock generator 120 may also be a divide-by-N circuit or a chain of divide-by-K circuits that divides the reference clock by an integer N. In one embodiment, the clock signal has a frequency of 2.5 GHz. The clock signal has a positive-going edge and a negative-going edge, or first and second edges in opposite directions. Typically the clock signal has a duty cycle of approximately 50%, i.e., the time interval when the clock signal is HIGH is approximately equal to the time interval when the clock signal is LOW.

The non-integer clock divider 130 divides the clock signal by a non-integer value M. The non-integer value may be a sum of an integer K and a fractional part F. In one embodiment, the fractional part is approximately equal to ½ and the non-integer value M is equal to K+½.

Figure 2:
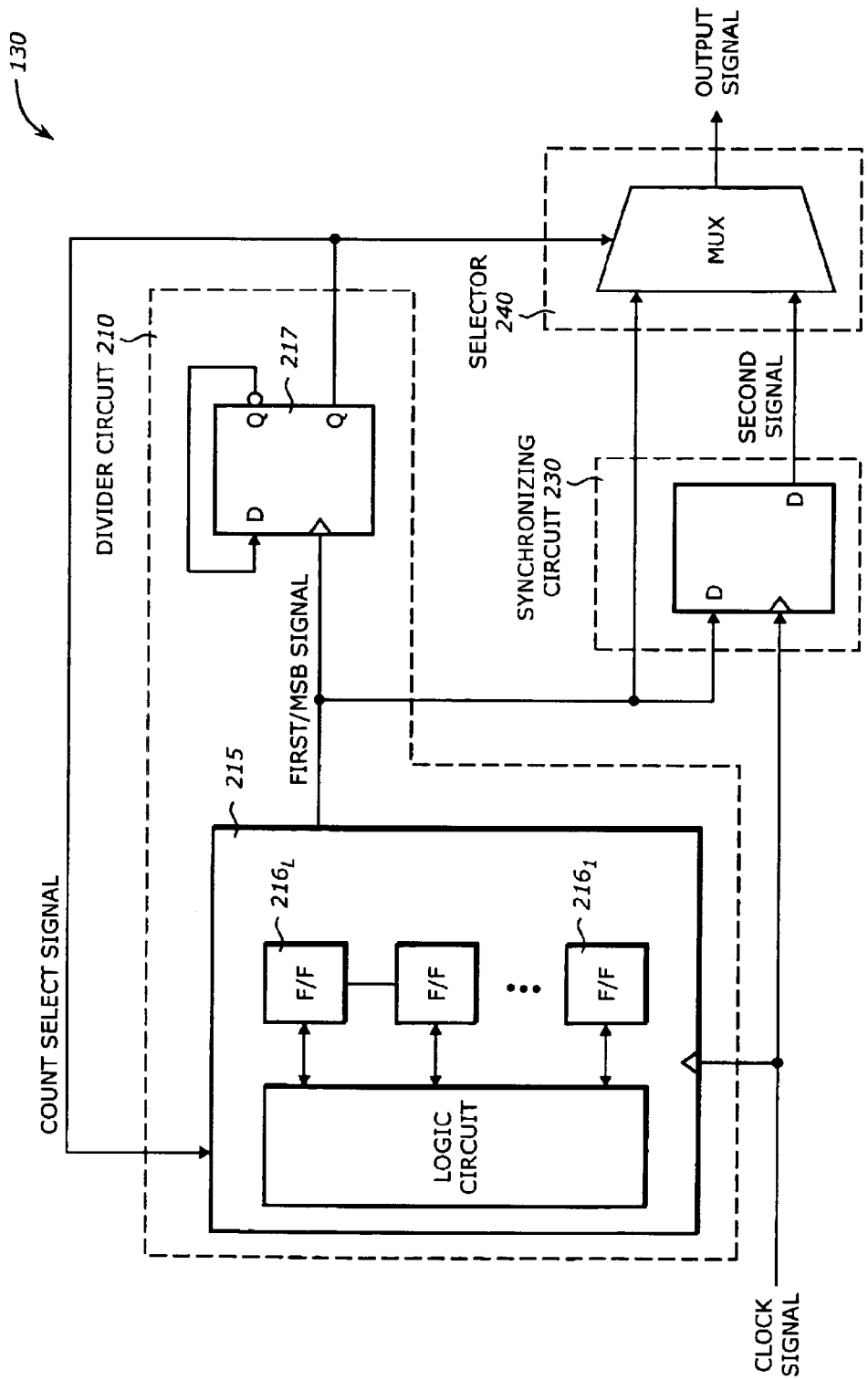
FIG. 2 is a diagram illustrating a non-integer clock divider of FIG. 1 in accordance with one embodiment of the invention.

FIG. 2 is an exemplary non-integer clock divider 130 of FIG. 1 in accordance to one embodiment of the invention. The clock divider 130 includes a divider circuit 210, a synchronizing circuit 230, and a selector 240.

The divider circuit 210 divides the clock signal by a variable divisor. In one embodiment, the variable divisor has two alternating divisors, a first divisor and a second divisor. The first divisor may be an integer value K and the second divisor may be an integer value K+1. The divider circuit 210 divides the clock signal by the first divisor in a first period and by the second divisor in a second period. The second period follows the first period. The divider circuit 210 is triggered by the first edge of the clock signal and generates a first signal.

The divider circuit 210 includes a L-bit counter 215 and a toggling circuit 217. The L-bit counter 215 counts, for example, to the first and second divisors alternately using a count select signal provided by the toggling circuit 217. The L-bit counter 215 generates a counter output which has a most significant bit (MSB) signal representing a MSB of the counter output.

The L-bit counter 215 can be implemented by L flip-flops $216_L$ to $216_1$ where each flip-flop corresponds to a bit in the counter output. For example, a 5-bit counter is required for divisors values of 16 and 17, and the MSB signal may be the output of the flip-flop corresponding to bit 3 of the count output where bit 0 is the least significant bit. The MSB signal corresponds to the first signal. When the value of K is a power of 2, the MSB signal provides an approximately 50% duty signal. For example, when K=16, L=5, the counting sequence is: 0, . . . , 7, 8, 9, . . . , 15, 0, 1, . . . , 7, 8, 9, . . . 15, 16, . . . The first period is the period for the count from 0 to 15 and the second period is the period for the count from 0 to 16. The counting cycle is then repeated. In other words, the L-bit counter 215 counts to 16, then 17, then 16, then 17, and so on. For this sequence, the MSB signal is LOW for 8 clock periods (when the count goes from 0 to 7), and HIGH for 8 clock periods (when the count goes from 8 to 15). Next, the MSB signal is LOW for 8 clock periods (when the count goes from 0 to 7), HIGH for 8 clock periods (when the count goes from 8 to 15) and LOW for 9 clock periods (when the count goes from 16, back to 0 and to 7). The cycle is repeated.

The toggling circuit 217 generates the count select signal from the MSB signal. The count select signal selects the first and second divisors in the L-bit counter 215 by alternately selecting and de-selecting the (K1)-th count state. The toggling circuit 217 is essentially a divide-by-2 circuit and can be implemented by a flip-flop. The MSB signal is connected to the clock input of the flip-flop and the output of the flip-flop is connected back to its input. For the divisors of 16 and 17, the count select signal is LOW for 16 clock periods, HIGH for 17 clock periods, LOW for 16 clock periods, and HIGH for 17 clock periods, and so on. When the count select signal is LOW, the L-bit counter 215 is counting from 0 to K−1. During this period, the $(K+1)^{th}$ count state is selected so that in the next period, the L-bit counter can count from 0 to K. When the count select signal is HIGH, the L-bit counter 215 is counting from 0 to K. During this period, the $(K+1)^{th}$ count state is de-selected so that in the next period, the L-bit counter 215 can count from 0 to K−1. The cycle is then repeated.

The synchronizing circuit 230 generates a second signal from the first signal. The second signal is synchronized by the second edge of the clock signal where the second edge is in a direction opposite to the first edge. If the first edge is the positive-going edge then the second edge is the negative-going edge, or vice versa. Namely, the second signal is shifted from the first signal by a time interval approximately equal to half the period of the clock signal when the duty cycle of the clock signal is approximately equal to 50%. In one embodiment, the synchronizing circuit 230 is a D flip-flop. The clock input of the flip-flop is connected to the complement of the clock signal so that it is clocked by the second edge of the clock signal. For a 2.5 GHz clock signal, the shift interval is approximately equal to 200 picoseconds (ps).

The selector 240 generates an output signal by selecting the first signal and the second signal alternately between the first period and the second period. The output signal has a clock frequency approximately equal to K+½. In one embodiment, the selector 240 is a two-to-one multiplexer. The two inputs to the multiplexer 240 are the first signal and the second signal. The select signal to the multiplexer 240 is the count select signal from the divider circuit 210. When the count select signal is LOW, the multiplexer 240 selects the first signal as the output signal. When the count select signal is HIGH, the multiplexer 240 selects the second signal as the output signal. As would be understood by one skilled in the art, the inputs to the multiplexer 240 may be reversed such that when the count select signal is LOW and HIGH, the multiplexer 240 selects the second signal and the first signal, respectively, as the output signal. The output signal therefore appears as a divide-by-(K+½) signal from the clock signal.

Figure 3:
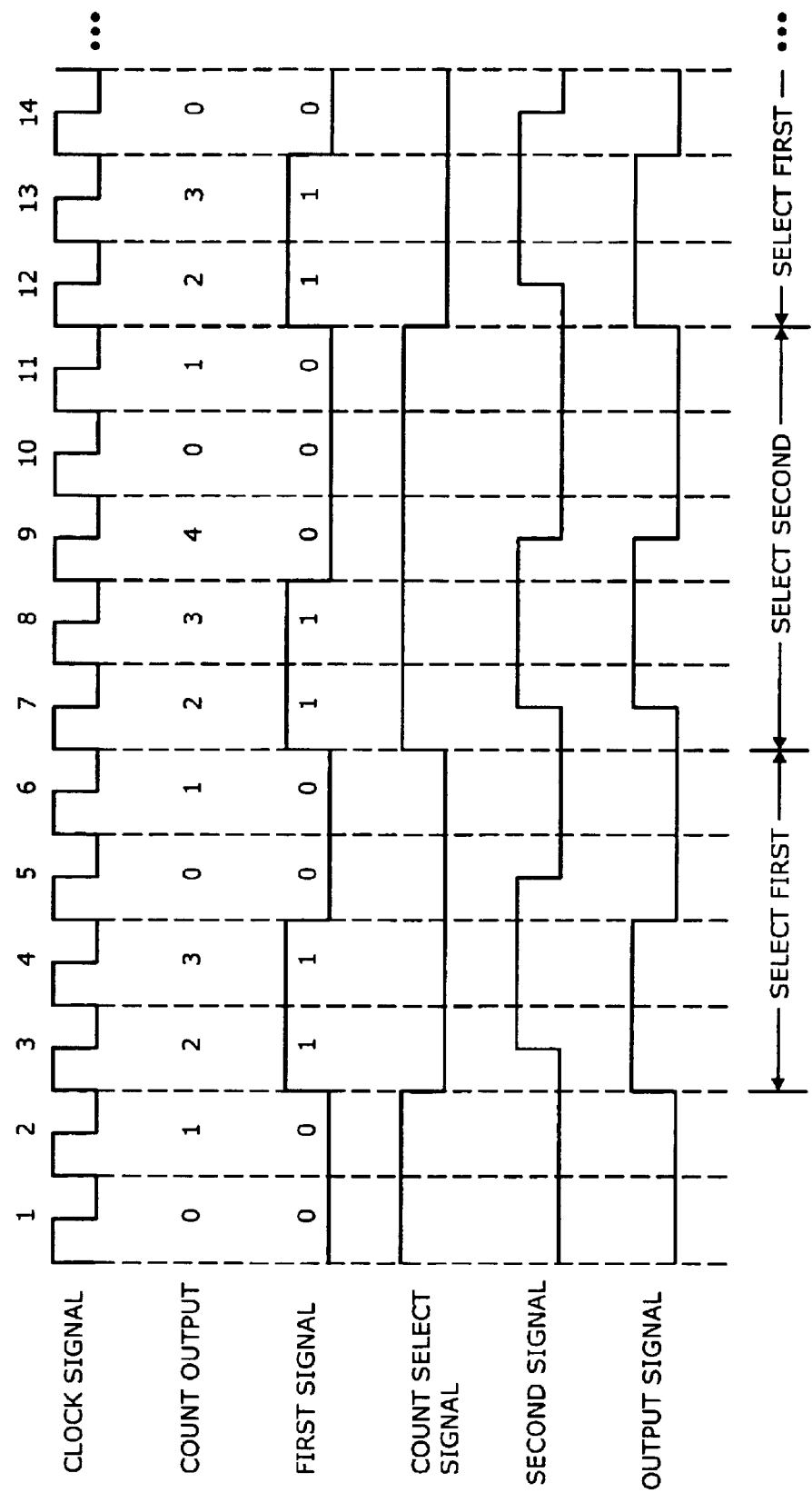
FIG. 3 is a timing diagram illustrating timing waveforms of the non-integer clock divider in accordance with one embodiment of the invention.

FIG. 3 is a timing diagram illustrating timing waveforms of the non-integer clock divider according to one embodiment of the invention. For purposes of illustration, the following values are used: K=4, L=3, i.e., the first divisor is 4 and the second divisor is 5. The timing diagram shows the waveforms for the following signal: the clock signal, the count output, the MSB signal (or the first signal), the count select signal, the second signal, and the output signal.

The clock signal is the reference clock signal to be divided. The clock signal has a positive-going edge and a negative-going edge. Suppose the divider circuit 210 (FIG. 2) is triggered by the positive-going edge, the resulting count output is valid at the positive edge as shown. The count output sequence is 0, 1, 2, 3, 0, 1, 2, 3, 4, . . . The MSB signal corresponds to bit 1 of the count output (where bit 0 is the least significant bit). The MSB signal is LOW from clocks 1 to 2, HIGH from clocks 3 to 4, LOW from clocks 5 to 6, HIGH from clocks 7 to 8, LOW from clocks 9 to 11 (3 clock periods), HIGH from clocks 12 to 13, LOW from clocks 14 to 15, HIGH from clocks 16 to 17, LOW from clocks 18 to 20 (3 clock periods), and so on. In this waveform, the first period corresponding to the first divisor of 4 is from clock 3 to clock 6 (4 clock periods). The second period corresponding to the second divisor of 5 is from clock 7 to clock 11 (5 clock periods).

The count select signal is a divide-by-2 signal from the MSB signal. It changes state at each positive-going edge of the MSB signal. As shown in the timing diagram, the count select signal is LOW from clocks 3 to 6, HIGH from clocks 7 to 11, LOW from clocks 12 to 15, HIGH from clocks 16 to 20, and so on.

The second signal is a signal obtained from the MSB signal by synchronizing the MSB signal with the negative-going edge of the clock signal. In other words, the second signal is shifted by half of a clock period from the MSB signal.

The count select signal is used as a select signal to the multiplexer to select either the MSB signal or the second signal as the output signal. When the count select signal is LOW, the multiplexer selects the first signal (i.e., the MSB signal). When the count select signal is HIGH, the multiplexer selects the second signal. The resulting output signal therefore has a period of 4.5 clock periods.

In the above example, if K=16 and L=5, i.e., the first divisor is 16 ad the second divisor is 17, the resulting output signal would have a period of 16.5 clock periods. Therefore, a (/16.5) clock ratio is produced. Moreover, a (/16) clock ratio can be obtained by completely de-selecting the $17^{th}$ counter state. A (/33) and (/32) ratios can then be obtained by simple division of the output clock.

Also, although one embodiment of the invention has been described using two variable divisors, it would be understood by those skilled in the art that the invention is not limited to two variable divisors. For a divider circuit having I number of divisors, where I>2, the divider circuit may divide the clock signal by the $I^{th}$ divisor in the $I^{th}$ period, where each $I^{th}$ period follows the $(I-1)^{th}$ period. Alternatively, the divider circuit may select a predetermined number of divisors J from I divisors, where J<I, and divide the selected clock signals by the $J^{th}$ period, where each $J^{th}$ period follows the $(J-1)^{th}$ period.

Accordingly, the invention generates an output clock period with frequency that is a fractional or an integral multiple of a reference clock signal frequency. However, the foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus comprising:
   a divider circuit to divide a clock signal by a first divisor in a first period and by a second divisor in a second period, the second period following the first period, the divider circuit being triggered by a first edge of the clock signal, the divider circuit generating a first signal;
   a synchronizing circuit coupled to the divider circuit to generate a second signal from the first signal, the second signal being synchronized by a second edge of the clock signal, the second edge being in a direction opposite to the first edge; and
   a selector coupled to the synchronizing circuit and the divider circuit to generate an output signal by selecting the first signal and the second signal alternately between the first period and the second period.

2. The apparatus of claim 1, wherein the divider circuit comprises:
   a counter to count to the first and second divisors alternately using a count select signal, the counter generating a counter output having a most significant bit (MSB) signal representing a MSB of the counter output, the MSB signal corresponding to the first signal; and
   a toggling circuit coupled to the counter to generate the count select signal from the MSB signal, the count select signal selecting the first and second divisors.

3. The apparatus of claim 2, wherein the toggling circuit is a flip-flop clocked by the MSB signal.

4. The apparatus of claim 1, wherein the synchronizing circuit comprises:
   a flip-flop to synchronize the first signal by the second edge of the clock signal.

5. The apparatus of claim 2, wherein the selector comprises:
   a multiplexer to generate the output signal from the first and second signals using the count select signal.

6. The apparatus of claim 1, wherein the first divisor is an integer N.

7. The apparatus of claim 6, wherein the second divisor is an integer N+1.

8. The apparatus of claim 1, wherein the first and second periods differ by one clock period of the clock signal.

9. The apparatus of claim 7, wherein the output signal has an output period approximately equal to N+½.

10. The apparatus of claim 1, wherein the clock signal has a frequency greater than 1 GHz.

11. A method comprising:
    dividing a clock signal by a first divisor in a first period and by a second divisor in a second period using a divider circuit, the second period following the first period, the divider circuit being triggered by a first edge of the clock signal, the divider circuit generating a first signal;
    generating a second signal from the first signal by a synchronizing circuit, the second signal being synchronized by a second edge of the clock signal, the second edge being in a direction opposite to the first edge; and
    generating an output signal by selecting the first signal and the second signal alternately between the first period and the second period.

12. The method of claim 11, wherein dividing the clock signal using the divider circuit comprises:
    counting to the first and second divisors alternately using a count select signal to generate a counter output having a most significant bit (MSB), signal representing a MSB of the counter output, the MSB signal corresponding to the first signal; and
    generating the count select signal from the MSB signal, the count select signal selecting the first and second divisors.

13. The method of claim 12, wherein generating the count select signal comprises generating the count select signal using a flip-flop clocked by the MSB signal.

14. The method of claim 11, wherein generating the second signal comprises:
    synchronizing the first signal by the second edge of the clock signal.

15. The method of claim 12, wherein generating the output signal comprises generating the output signal from the first and second signals using the count select signal.

16. The method of claim 11, wherein the first divisor is an integer N.

17. The method of claim 16, wherein the second divisor is an integer N+1.

18. The method of claim 11, wherein the first and second periods differ by one clock period of the clock signal.

19. The method of claim 17, wherein the output signal has an output period approximately equal to N+½.

20. The method of claim 11, wherein the clock signal has a frequency greater than 1 GHz.

21. A circuit comprising:
    a clock generator to generate a clock signal having first and second edges in opposite directions; and
    a clock divider coupled to the clock generator to divide the clock signal by a non-integer divisor, the clock divider comprising:
      a divider circuit to divide the clock signal by a first divisor in a first period and by a second divisor in a second period, the second period following the first period, the divider circuit being triggered by the first edge of the clock signal, the divider circuit generating a first signal,
      a synchronizing circuit coupled to the divider circuit to generate a second signal from the first signal, the second signal being synchronized by the second edge of the clock signal, and
      a selector coupled to the synchronizing circuit and the divider circuit to generate an output signal by selecting the first signal and the second signal alternately between the first period and the second period.

22. The circuit of claim 21, wherein the divider circuit comprises:
    a counter to count to the first and second divisors alternately using a count select signal, the counter generating a counter output having a most significant bit (MSB) signal representing a MSB of the counter output, the MSB signal corresponding to the first signal; and
    a toggling circuit coupled to the counter to generate the count select signal from the MSB signal, the count select signal selecting the first and second divisors.

23. The circuit of claim 22, wherein the toggling circuit is a flip-flop clocked by the MSB signal.

24. The circuit of claim 21, wherein the synchronizing circuit comprises:
    a flip-flop to synchronize the first signal by the second edge of the clock signal.

25. The circuit of claim 22, wherein the selector comprises:
    a multiplexer to generate the output signal from the first and second signals using the count select signal.

26. The circuit of claim 21, wherein the first divisor is an integer N.

27. The circuit of claim 26, wherein the second divisor is an integer N+1.

28. The circuit of claim 21, wherein the first and second periods differ by one clock period of the clock signal.

29. The circuit of claim 27, wherein the output signal has an output period approximately equal to N+½.

30. The circuit of claim 21, wherein the clock signal has a frequency greater than 1 GHz.

* * * * *